(12) United States Patent
Obara et al.

(10) Patent No.: US 10,976,397 B2
(45) Date of Patent: Apr. 13, 2021

(54) MRI APPARATUS UTILIZING NON-ULTRASHORT TE(UTE) IMAGING TO GENERATE A MASK IMAGE FOR PERFORMANCE OF MASK PROCESSING

(71) Applicant: CANON MEDICAL SYSTEMS CORPORATION, Otawara (JP)

(72) Inventors: Takeshi Obara, Otawara (JP); Hidetaka Konta, Utsunomiya (JP); Shinya Ozawa, Nasushiobara (JP); Yoshimori Kassai, Nasushiobara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 42 days.

(21) Appl. No.: 16/400,161

(22) Filed: May 1, 2019

(65) Prior Publication Data

US 2019/0346525 A1 Nov. 14, 2019

(30) Foreign Application Priority Data

May 8, 2018 (JP) .............................. JP2018-090198

(51) Int. Cl.
*G01R 33/565* (2006.01)
*G01R 33/34* (2006.01)
*G01R 33/56* (2006.01)
*G01R 33/48* (2006.01)

(52) U.S. Cl.
CPC ... *G01R 33/5659* (2013.01); *G01R 33/34084* (2013.01); *G01R 33/4816* (2013.01); *G01R 33/5602* (2013.01)

(58) Field of Classification Search
CPC ............ G01R 33/5659; G01R 33/5602; G01R 33/4816; G01R 33/34084
See application file for complete search history.

(56) References Cited

U.S. PATENT DOCUMENTS

| 8,774,482 | B2 * | 7/2014 | Reisman ................... G06T 7/11 |
| | | | 382/131 |
| 9,594,139 | B2 * | 3/2017 | Wiesinger .......... G01R 33/5608 |
| 10,307,076 | B2 * | 6/2019 | Siu ...................... A61B 5/14546 |
| 10,543,361 | B2 * | 1/2020 | Ramani .................. A61B 5/062 |
| 10,591,569 | B2 * | 3/2020 | Ding .................... G01R 33/565 |
| 2011/0172517 | A1 * | 7/2011 | Schmidt ............... A61B 6/5247 |
| | | | 600/411 |
| 2011/0286649 | A1 * | 11/2011 | Reisman ............ G01R 33/4812 |
| | | | 382/131 |

(Continued)

FOREIGN PATENT DOCUMENTS

WO WO 2015/082128 A1 6/2015

*Primary Examiner* — Dixomara Vargas
(74) *Attorney, Agent, or Firm* — Oblon, McClelland, Maier & Neustadt, L.L.P.

(57) ABSTRACT

In one embodiment, an MRI apparatus includes a memory storing a predetermined program and processing circuitry. The processing circuitry configured, by executing the predetermined program, to generate a first image based on first data acquired from an object with Ultrashort TE (UTE), generate a second image based on second data acquired from the object with non-UTE, generate a mask image from the second image, and perform mask processing, by using the mask image, to remove or reduce an undesired signal around the object depicted in the first image.

14 Claims, 16 Drawing Sheets

(56) References Cited

U.S. PATENT DOCUMENTS

| | | | |
|---|---|---|---|
| 2012/0197104 A1* | 8/2012 | Posse | G01R 33/4833 600/410 |
| 2014/0221816 A1* | 8/2014 | Franke | G01R 33/4828 600/411 |
| 2014/0296696 A1* | 10/2014 | Remmele | A61B 6/4417 600/410 |
| 2015/0276906 A1* | 10/2015 | Wiesinger | G01R 33/5608 324/309 |
| 2016/0054416 A1* | 2/2016 | Stehning | A61B 5/4504 600/411 |
| 2018/0020946 A1* | 1/2018 | Siu | A61B 5/055 324/309 |
| 2019/0246938 A1* | 8/2019 | Gharagouzloo | G01R 33/56366 |
| 2019/0255315 A1* | 8/2019 | Ramani | A61B 5/055 |

* cited by examiner

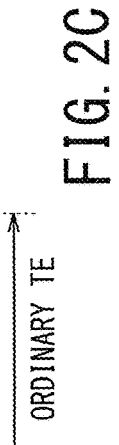
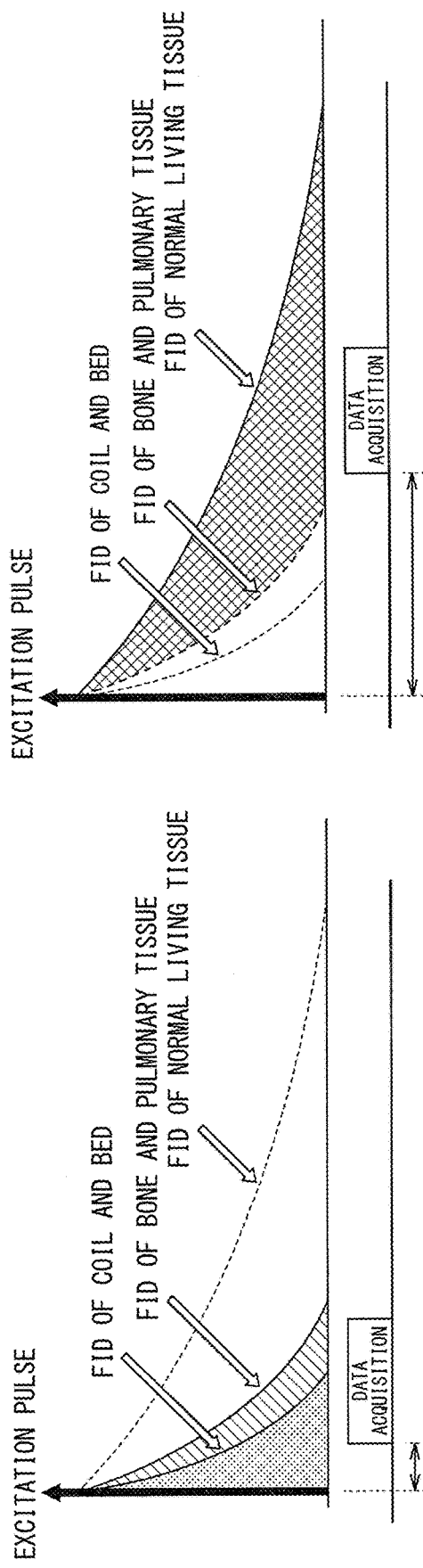
FIG. 2A
FIG. 2B
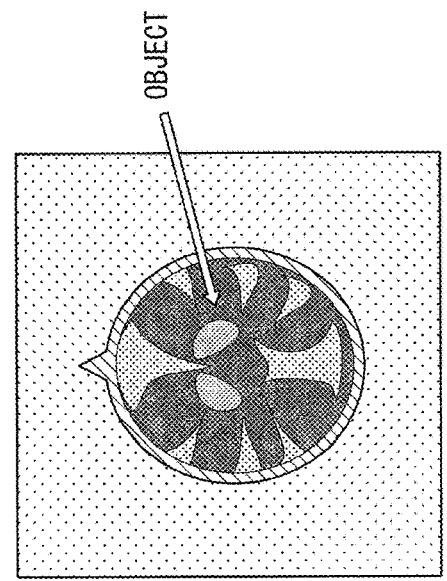
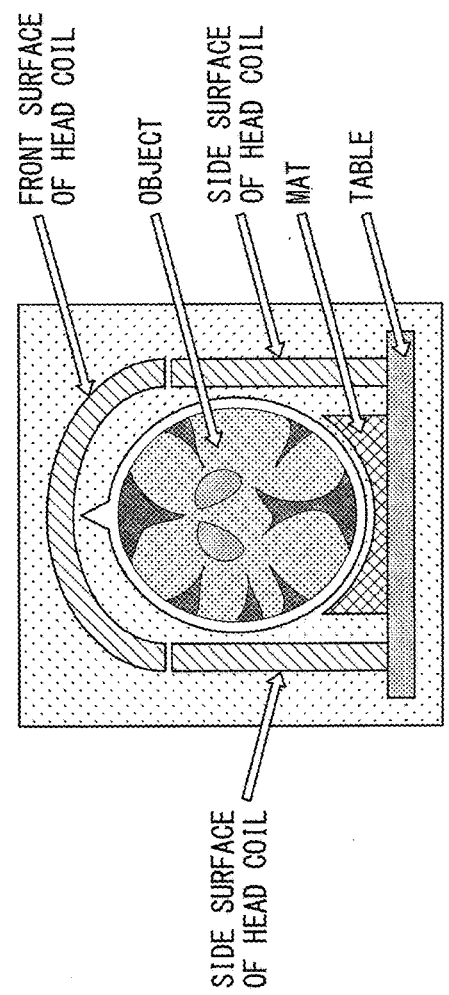
FIG. 2C
FIG. 2D

EXAMPLE OF RADIAL TRAJECTORY IN UTE IMAGING

ONE EXAMPLE OF DATABASE OF MASK PROCESSING METHOD

| SELECTION CONDITIONS OF MASK PROCESSING METHOD | MASK PROCESSING METHOD FOR UTE IMAGE | | | | | | | |
|---|---|---|---|---|---|---|---|---|
| | MASK PROCESSING METHOD WITHOUT USING MASK IMAGE | | MASK PROCESSING METHOD USING MASK IMAGE | | | | | |
| | METHOD OF USING SHAPE INFORMATION OF COIL | METHOD OF USING THRESHOLD PROCESSING | METHOD OF USING NON-UTE IMAGE DEDICATED FOR MASK PROCESSING | | METHOD OF USING NON-UTE IMAGE GENERATED FOR ANOTHER PURPOSE | | | |
| | | | DUAL-ECHO METHOD | SINGLE-ECHO METHOD | GENERATE FROM T1W-IMAGE | GENERATE FROM T2W-IMAGE | GENERATE FROM B1 MAP | GENERATE FROM SENSITIVITY MAP |
| SELECTION BASED ON COIL | ✓ | | | | | | | |
| SELECTION BASED ON PROTOCOL | | ✓ | ✓ | | ✓ | | | |
| SELECTION BASED ON IMAGING PART | | ✓ | ✓ | ✓ | ✓ | ✓ | ✓ | ✓ |
| ARBITRARY USER SELECTION | ✓ | | | | | ✓ | ✓ | ✓ |

FIG. 16

மாஇ APPARATUS UTILIZING
NON-ULTRASHORT TE(UTE) IMAGING TO
GENERATE A MASK IMAGE FOR
PERFORMANCE OF MASK PROCESSING

CROSS-REFERENCE TO RELATED
APPLICATION

This application is based upon and claims the benefit of priority from Japanese Patent Application No. 2018-090198, filed on May 8, 2018, the entire contents of which are incorporated herein by reference.

FIELD

Embodiments described herein relate generally to a magnetic resonance imaging (MRI) apparatus.

BACKGROUND

An MRI apparatus is an imaging apparatus that magnetically excites nuclear spin of an object placed in a static magnetic field by applying a radio frequency (RF) pulse having the Larmor frequency and reconstructs an image on the basis of magnetic resonance (MR) signals emitted from the object due to the excitation.

In the field of MRI, an imaging technique called ultrashort TE (UTE) imaging is known. The UTE imaging is performed by using a pulse sequence in which the period from an application of an excitation pulse to data acquisition (i.e., echo time TE) is set to a very short span.

Since the transverse relaxation time (T2 or T2*) of tissues with less water such as bones or the lungs is very short in general, MR signals from the bones or the lungs decay immediately after the application of the excitation pulse. Thus, even in the case of using a pulse sequence with a relatively short echo time TE in the conventional imaging methods, for example, with TE of about several milliseconds, it has been difficult to depict a bone region and/or a lung region (i.e., pulmonary region).

The UTE imaging has been developed as an imaging method capable of depicting the bone region and/or the lung region by setting the echo time TE to a value much shorter than that of the conventional technique to acquire the MR signals even from the tissues such as the bone region and/or the lung region, which have a very short transverse relaxation time.

However, it has been found out that setting the echo time TE very short causes the MRI apparatus, in the UTE imaging, to receive MR signals not only from the object such as a human body but also from non-living substances such as a coil device or a bed around the object. Thus, the UTE image may include not only desired components such as bones or lungs of the object but also undesired components such as the coil device and/or the bed around the object.

BRIEF DESCRIPTION OF THE DRAWINGS

In the accompanying drawings:
FIG. 2A to FIG. 2D are schematic diagrams for qualitatively illustrating the reason why undesired components are depicted from undesired signals in an UTE image;
FIG. 16 is a table illustrating a concept of mask processing database.

DETAILED DESCRIPTION

Hereinafter, respective embodiments of MRI apparatuses will be described by referring to the accompanying drawings. In the following embodiments, components assigned with the same reference sign are assumed to function and operate in the same manner, and duplicate description is omitted.

In one embodiment, an MRI apparatus includes a memory storing a predetermined program and processing circuitry. The processing circuitry configured, by executing the predetermined program, to generate a first image based on first data acquired from an object with Ultrashort TE (UTE), generate a second image based on second data acquired from the object with non-UTE, generate a mask image from the second image, and perform mask processing, by using the mask image, to remove or reduce an undesired signal around the object depicted in the first image.

First Embodiment

Figure 1:
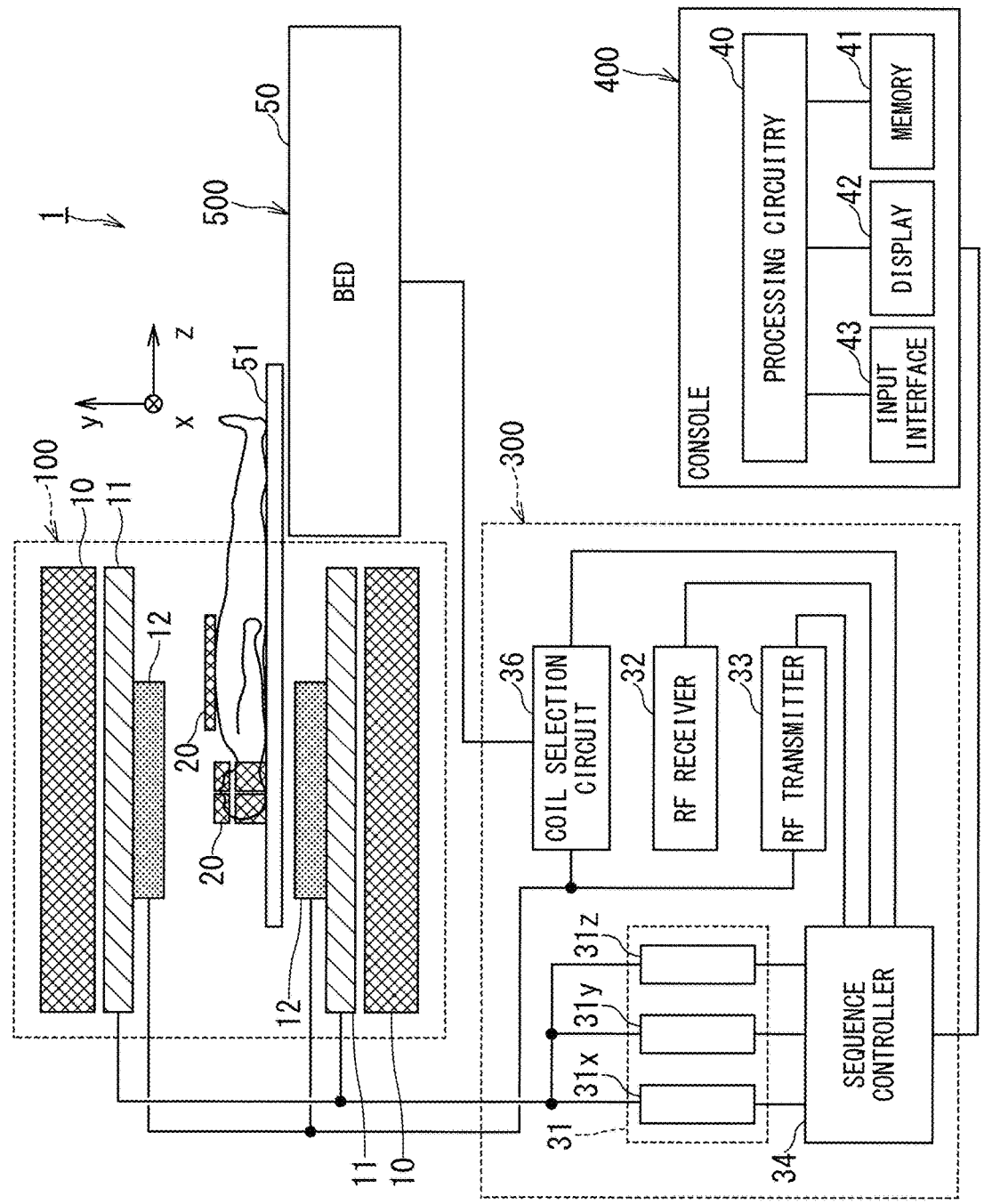
FIG. 1 is a block diagram illustrating overall configuration of the MRI apparatus of the first embodiment.

FIG. 1 is a block diagram illustrating overall configuration of an MRI apparatus 1 according to the first embodiment. The MRI apparatus 1 includes a gantry 100, a control cabinet 300, a console 400, a bed 500, and Radio Frequency (RF) coils 20.

The gantry 100 includes a static magnetic field magnet 10, a gradient coil 11, and a whole body (WB) coil 12, and these components are housed in a cylindrical housing. The bed 500 includes a bed body 50 and a table 51.

The control cabinet 300 includes three gradient coil power supplies 31 (31x for an X-axis, 31y for a Y-axis, and 31z for a Z-axis), a coil selection circuit 36, an RF receiver 32, an RF transmitter 33, and a sequence controller 34.

The console 400 includes processing circuitry 40, a memory 41, a display 42, and an input interface 43. The console 400 functions as a host computer.

The static magnetic field magnet 10 of the gantry 100 is substantially in the form of a cylinder, and generates a static magnetic field inside a bore into which an object, e.g., a patient is transported. The bore is a space inside the cylindrical structure of the gantry 100. The static magnetic field magnet 10 includes a superconducting coil inside, and the superconducting coil is cooled down to an extremely low temperature by liquid helium. The static magnetic field magnet 10 generates a static magnetic field by supplying the superconducting coil with an electric current provided from a non-illustrated static magnetic field power supply in an excitation mode. Afterward, the static magnetic field magnet 10 shifts to a permanent current mode, and the static magnetic field power supply is separated. Once it enters the permanent current mode, the static magnetic field magnet 10 continues to generate a strong static magnetic field for a long time, e.g., over one year.

The gradient coil 11 is also substantially in the form of a cylinder and is fixed to the inside of the static magnetic field magnet 10. This gradient coil 11 applies gradient magnetic fields (e.g., gradient pulses) to an object in the respective directions of the X-axis, the Y-axis, and the Z-axis, by using electric currents supplied from the gradient coil power supplies 31x, 31y, and 31z.

The bed body 50 of the bed 500 can move the table 51 in the vertical direction and in the horizontal direction. The bed body 50 moves the table 51 with an object placed thereon to a predetermined height before imaging. Afterward, when the object is imaged, the bed body 50 moves the table 51 in the horizontal direction so as to move the object to the inside of the bore.

The WB body coil 12 is shaped substantially in the form of a cylinder so as to surround the object, and is fixed to the inside of the gradient coil 11. The WB coil 12 applies RF pulses transmitted from the RF transmitter 33 to the object. Further, the WB coil 12 receives magnetic resonance signals, i.e., MR signals emitted from the object due to excitation of hydrogen nuclei.

The MRI apparatus 1 includes the RF coils 20 as shown in FIG. 1 in addition to the WB coil 12. Each of the RF coils 20 is placed close to the body surface of the object, and includes plural coil elements. These plural coil elements are arrayed inside each RF coil 20, and thus may be called phased array coils (PAC) in some cases. There are various types for the RF coils 20. For instance, as shown in FIG. 1, there are a body coil attached to the chest, abdomen, or legs of the object, and a spine coil attached to the back side of the object. As other types of the RF coils 20, e.g., there are a head coil for imaging the head of the object and a foot coil for imaging the foot. Of these various types of RF coils, FIG. 1 illustrates the body coil and the head coil. Although most of the RF coils 20 are dedicated for reception, some of the RF coils 20 such as the head coil perform both transmission and reception. The RF coils 20 are configured to be attachable to and detachable from the table 51 via a cable.

The RF transmitter 33 generates an RF pulse on the basis of an instruction from the sequence controller 34. The generated RF pulse is transmitted to the WB coil 12 and applied to the object. An MR signal is generated from the object by the application of the RF pulse. This MR signal is received by the RF coils 20 or the WB coil 11.

The MR signals received by the RF coils 20, more specifically, the MR signals received by each of the coil elements in the RF coils 20, are transmitted to the coil selection circuit 36 via cables provided on the table 51 and the bed body 50. The coil selection circuit 36 selects a signal outputted from each RF coil 20 or a signal outputted from the WB coil depending on a control signal outputted from the sequence controller 34 or from the console 400.

The selected signals are outputted to the RF receiver 32. The RF receiver 32 performs analog to digital (AD) conversion on the channel signals, i.e., the MR signals, and outputs the converted signals to the sequence controller 34. The digitized MR signals are referred to as raw data in some cases. The AD conversion may be performed inside each RF coil 20 or by the coil selection circuit 36.

The sequence controller 34 performs a scan of the object by driving the gradient coil power supplies 31, the RF transmitter 33, and the RF receiver 32 under the control of the console 400. When the sequence controller 34 receives raw data from the RF receiver 32 by performing the scan, the sequence controller 34 transmits the received raw data to the console 400.

The sequence controller 34 includes non-illustrated processing circuitry. This processing circuitry is configured as, e.g., a processor for executing predetermined programs or configured as hardware such as a field programmable gate array (FPGA) or an application specific integrated circuit (ASIC).

The console 400 includes the memory 41, the display 42, the input interface 43, and the processing circuitry 40.

The memory 41 is a recording medium including a read-only memory (ROM) and a random access memory (RAM) in addition to an external memory device such as a hard disk drive (HDD) and an optical disc device. The memory 41 stores various programs executed by a processor of the processing circuitry 40 as well as various types of data and information.

The input interface 43 includes various devices for an operator to input various types of information and data, and is configured of, e.g., a mouse, a keyboard, a trackball, and/or a touch panel.

The display 42 is a display device such as a liquid crystal display panel, a plasma display panel, and an organic EL panel.

The processing circuitry 40 is, e.g., a circuit equipped with a central processing unit (CPU) and/or a special-purpose or general-purpose processor. The processor implements various functions described below by executing the programs stored in the memory 41. The processing circuitry 40 may be configured of hardware such as an FPGA and an ASIC. The various functions described below can also be implemented by such hardware. Additionally, the processing circuitry 40 can implement the various functions by combining hardware processing and software processing based on its processor and programs.

In the configuration of the MRI apparatus 1 shown in FIG. 1, all the components except the console 400 constitute an imaging unit, or a scanner. That is, the control cabinet 300, the gantry 100, and the bed 500 constitute the scanner. In the following description, an image acquired by the UTE imaging is referred to as a UTE image. Further MR signals from a non-living substance such as a coil device and/or a bed around the object are referred to as undesired signals. FIG. 2A to FIG. 2D are schematic diagrams qualitatively illustrating the reason why, in the UTE imaging, not only MR signals (i.e., desired signals) from an object such as a human body but also the undesired signals are received, in comparison with a non-UTE image.

In the following description, an imaging method except the UTE imaging method is referred to as a non-UTE imaging method, and an image acquired by the non-UTE imaging method is referred to as a non-UTE image. Additionally, in some cases, the UTE imaging method is shortly referred to as UTE imaging and the non-UTE imaging method is shortly referred to as non-UTE imaging.

The UTE imaging method and the non-UTE imaging method can be defined as follows. For instance, the UTE imaging method can be defined as an imaging method of setting an echo time (TE) to a short value to such an extent that the signal value of each undesired signal from the substance around the object becomes equal to or higher than a predetermined threshold value with respect to background noise (e.g. six times or more higher than the signal value of the background noise). On the other hand, the non-UTE imaging method can be defined as an imaging method in which the echo time (TE) is set to an appropriate value in such a manner that the signal value of each undesired signal from the substance around the object becomes lower than a predetermined threshold value with respect to the background noise (e.g. six times or less than the signal value of the background noise)

Alternatively, the UTE imaging can also be defined as an imaging method performed by setting the echo time (TE) short enough to receive a free induction decay signal from a non-living object around the living body, and the non-UTE imaging can also be defined as an imaging method performed by setting the echo time (TE) to an appropriate value in such a manner that a free induction decay signal from the non-living object around the living body is not received.

Further alternatively, the UTE imaging method can also be defined as an imaging method in which the echo time is set to a value less than 1 millisecond, and the non-UTE imaging can also be defined as an imaging method in which the echo time is set to a value equal to or longer than 1 millisecond.

In either definition, the echo time of the UTE imaging method is set much shorter than the echo time of any conventional imaging method (i.e., the non-UTE imaging).

As schematically illustrated in FIG. 2A and FIG. 2C, the transverse relaxation time (T2 or T2*) of tissues with low water content such as a bone region and/or a lung region is very short, and thus the MR signals from the bone region and/or the lung region (i.e., free induction decay signal: FID) decays immediately after the application of the excitation pulse.

In the conventional non-UTE imaging method as schematically shown in FIG. 2C, even when the echo time is set as short as, e.g., several milliseconds, it is difficult to depict the bone region and the lung region.

In the UTE imaging method, the MR signals from tissues with very short transverse relaxation time such as the bone region and/or the lung region can also be acquired by setting the echo time TE much shorter than the conventional technique, and thus the bone region and/or the lung region can be depicted.

However, in the UTE imaging, setting echo time to a very short value causes the above-described demerit. That is, in the UTE imaging, not only MR signals from the object such as a human body but also MR signals (i.e., free induction decay signal: FID) from non-living substances such as a coil device and/or a bed around the object.

For instance, when the axial cross-section of the head is imaged under the conventional non-UTE imaging method, only the axial cross-section of the head is depicted as shown in FIG. 2D. However, when the axial cross-section of the head is imaged under the UTE imaging method, undesired components such as the front portion and side portion of the head coil, the table 51, and a mat are depicted in the UTE image in addition to the axial cross-section of the head as shown in FIG. 2B. These are the issues to be solved.

Figure 3:
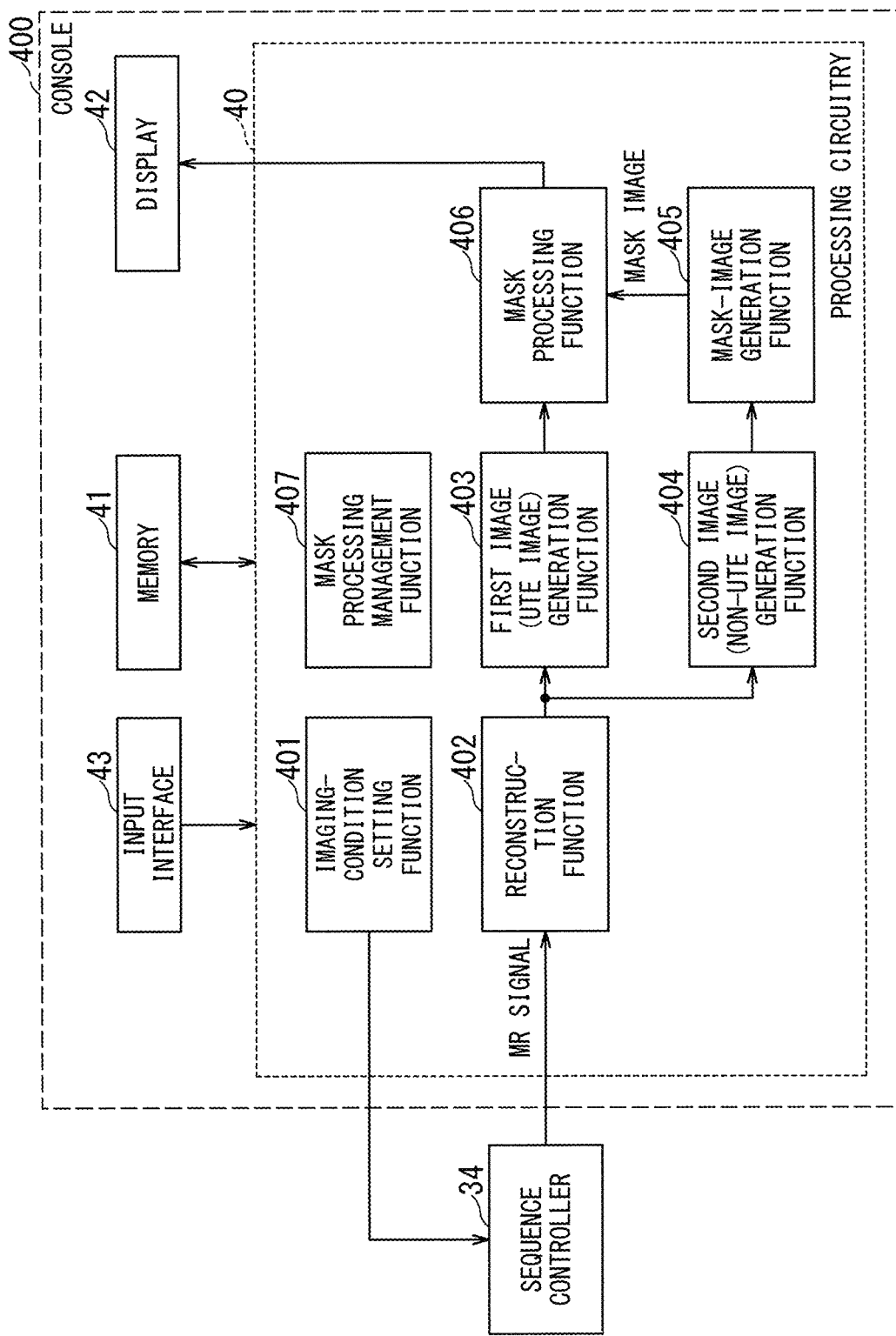
FIG. 3 is a functional block diagram illustrating the MRI apparatus of the first embodiment.
Figure 4:
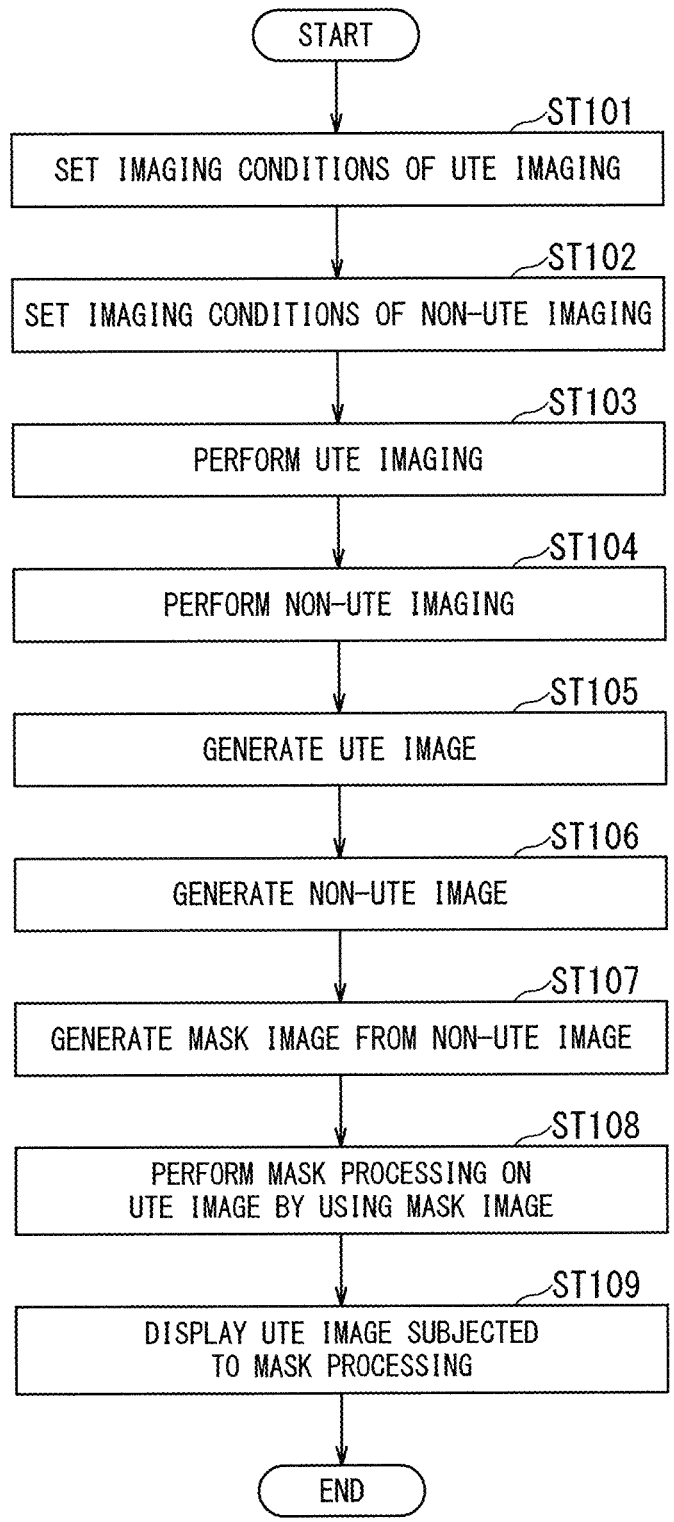
FIG. 4 is a flowchart illustrating processing performed by the MRI apparatus of the first embodiment.

The MRI apparatus 1 according to the first embodiment solves the above-described issues, and the same holds true for the other embodiments. FIG. 3 is a block diagram illustrating the functions implemented by the MRI apparatus 1 according to the first embodiment, in particular, the functions implemented by the console 400. FIG. 4 is a flowchart illustrating processing performed by the MRI apparatus 1 according to the first embodiment.

As shown in FIG. 3, the processing circuitry 40 of the console 400 implements an imaging-condition setting function 401, a reconstruction function 402, a first image (UTE image) generation function 403, a second image (non-UTE image) generation function 404, a mask-image generation function 405, a mask processing function 406, and a mask processing management function 407. Each of these functions is implemented by the processor included in the processing circuitry 40 to execute the predetermined programs stored in the memory 41, for instance. Among the above-described functions, the mask-processing management function 407 is a function of mainly managing the execution conditions and execution timing of the mask processing described below.

Each function other than the mask-processing management function 407 will be described in accordance with each step number in the flowchart of FIG. 4.

The steps ST101 and ST102 in FIG. 4 are processing corresponding to the imaging-condition setting function 401. In the respective steps ST101 and 102, the processing circuitry 40 sets the imaging conditions for the UTE imaging and the non-UTE imaging on the basis of the operation on the input interface 43 to be performed by a user. The order of setting the imaging conditions for the UTE imaging and the imaging conditions for the non-UTE imaging may be reversed in FIG. 4 or the imaging conditions of both imaging methods may be set in one step.

The imaging conditions include, e.g., types of pulse sequences such as the UTE imaging and the non-UTE imaging described below, and various parameters for defining the pulse sequence such as an echo time TE, a repetition time TR, flip angle, slice thickness, and number of slices.

Further, the imaging conditions include a protocol (i.e., a pulse sequence set), which defines a combination of plural pulse sequences including the respective pulse sequences of the UTE imaging and the non-UTE imaging and other pulse sequences and execution order of these pulse sequences, and the identification information the protocol.

Furthermore, the imaging conditions include information on an anatomical imaging part such as the head and abdomen, information on an imaging region such as a position and size of FOV (Field of View), information on resolution of the FOV, and information on the type of RF coil(s) used in each pulse sequence.

The processing circuitry 40 presents the above-described imaging conditions to a user via a graphical user interface (GUI), and determines the imaging conditions by accepting the selection and change of the imaging conditions from the user. The processing circuitry 40 sets the determined imaging conditions on the sequence controller 34.

After setting the imaging conditions, when the operator instructs to start imaging, the UTE imaging is performed in the step ST103 and the non-UTE imaging is performed in the step ST104. The UTE imaging and the non-UTE imaging are performed by the scanner (i.e., imaging unit).

The UTE imaging means an operation or processing for acquiring MR signals to be used for generating UTE images (i.e., UTE data), and the non-UTE imaging means an operation or processing for acquiring MR signals to be used for generating non-UTE images (i.e., non-UTE data)

Thus, the UTE data and the non-UTE data may be acquired by execution of separate pulse sequences that are independent of each other. Alternatively, the UTE data and the non-UTE data may be acquired in time division by execution of one pulse sequence as in the pulse sequence of dual-echo imaging described below.

In the former case, the order of the steps ST103 and ST104 may be reversed in FIG. 4. In the latter case, both of the UTE data and the non-UTE data are acquired in one step.

In the next step ST105, the UTE image is generated. In the next step ST106, the non-UTE image is generated. The processing of the step ST105 is performed by the reconstruction function 402 and the first image (UTE image) generation function 403 shown in FIG. 3. The processing of the step ST106 is performed by the reconstruction function 402 and the second image (non-UTE image) generation function 404 shown in FIG. 3.

The order of the processing in the steps ST105 and ST106 may be the reverse of that in FIG. 4 or the processing in both of the steps ST105 and ST106 may be performed simultaneously.

Figure 5:
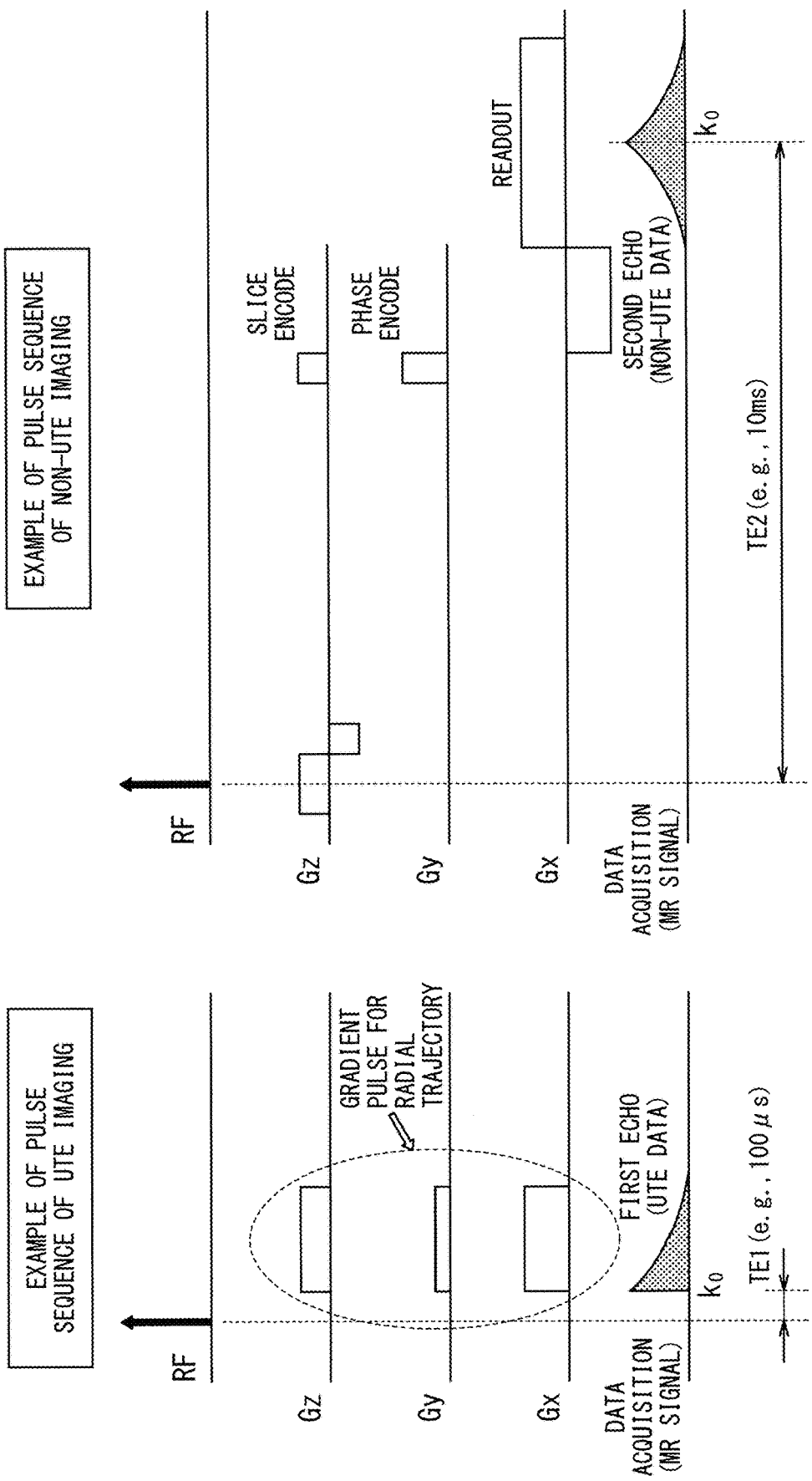
FIG. 5A is a schematic timing chart illustrating a pulse sequence for acquiring UTE data as a single echo.
FIG. 5B is a schematic timing chart illustrating a pulse sequence for acquiring non-UTE data as a single echo.

FIG. 5A and FIG. 5B are a timing chart illustrating a pulse sequence for acquiring the UTE data and a timing chart illustrating a pulse sequence for acquiring the non-UTE data, respectively, when the UTE data and the non-UTE data are separately acquired as a single echo by pulse sequences independent of each other.

Figure 6:
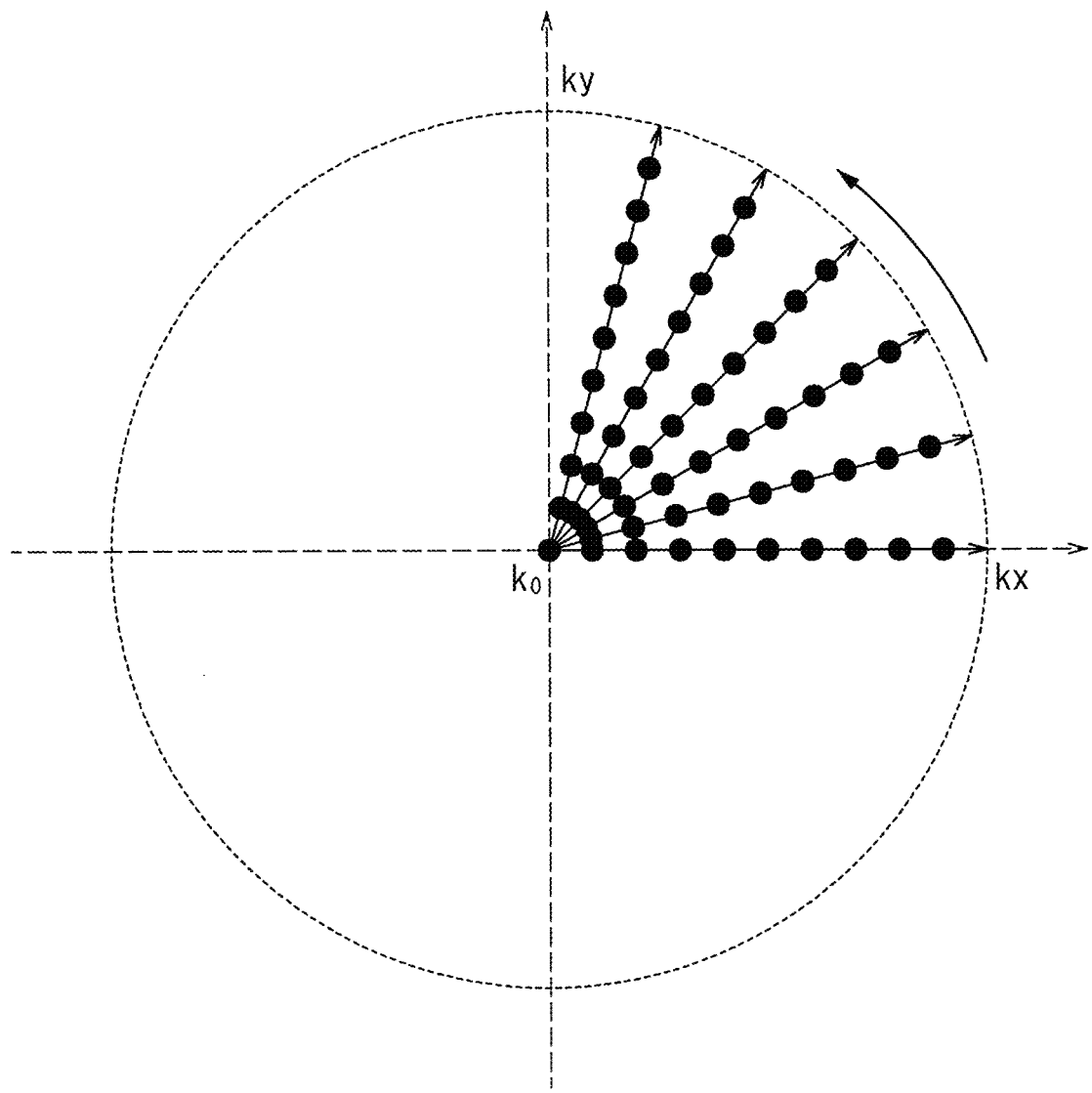
FIG. 6 is a schematic diagram illustrating a radial trajectory scan in the UTE imaging.

In the pulse sequence of the UTE imaging, as shown in FIG. 6 for instance, a radial scan with a radial trajectory is performed. In the radial scan, a Z-axis direction gradient magnetic field Gz, a Y-axis direction gradient magnetic field Gy, and an X-axis direction gradient magnetic field Gx are applied such that k-space is filled from its center (i.e., the origin of k-space coordinates denoted by k0) toward its outer side. Although FIG. 6 illustrates a two-dimensional k-space for convenience, it is also possible to perform a scan such that three-dimensional k-space is filled in accordance with radial trajectory.

When k-space is filled in accordance with a trajectory of an orthogonal coordinate system (i.e., Cartesian trajectory), as in the case of the conventional non-UTE imaging, some gradient pulses are applied before the start of data acquisition. For example, as illustrated in FIG. 5B, the rear half of the slice-selection gradient pulse Gz, the rephasing gradient pulse Gz, the slice encoding gradient pulse Gz, the phase encoding gradient pulse Gy, and the inverse gradient pulse Gx for prephasing are applied between an excitation pulse and the readout gradient pulse Gx. Thus, the echo time TE (i.e., the time from application of the excitation pulse to the start of data acquisition) cannot be extremely shortened. For instance, as illustrated in FIG. 5B, the echo time TE2 is generally set to an echo time of 1 millisecond or more, such as 10 milliseconds.

By contrast, the pulse sequence for the UTE imaging, as shown in FIG. 5A, does not require the above-described gradient pulses between the excitation pulse and the start of data acquisition, and can acquire data immediately after application of the excitation pulse. Thus, it is possible to set the echo time TE1 to a significantly short value. For instance, as illustrated in FIG. 5A, it is possible to set a short echo time of less than 1 millisecond such as 100 microseconds, and it is also possible to make the echo time TE substantially zero.

Figure 7:
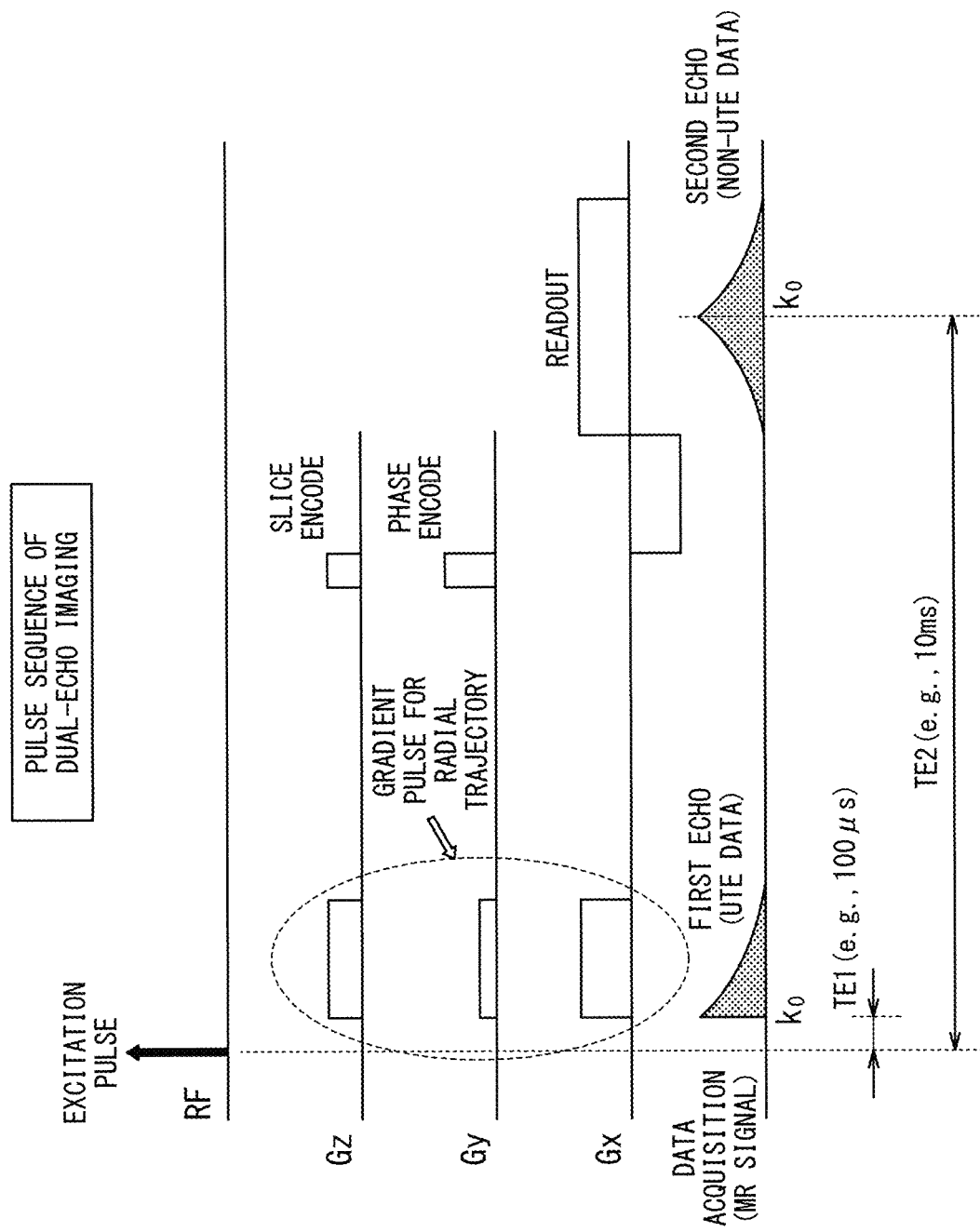
FIG. 7 is schematic timing chart illustrating a pulse sequence for acquiring UTE data and non-UTE data as dual-echo.

FIG. 7 is a schematic timing chart illustrating a pulse sequence for consecutively acquiring UTE data and non-UTE data after application of one excitation pulse, i.e., a pulse sequence of dual-echo imaging. Immediately after application of the excitation pulse, the same gradient pulses Gz, Gy, and Gx as those in FIG. 5A are applied for acquiring the UTE data, for instance. After acquisition of the UTE data, the same gradient pulses Gz, Gy, and Gx as those in FIG. 5B are applied for acquiring the non-UTE data, for instance.

In the dual-echo imaging, the UTE data and the non-UTE data are acquired substantially simultaneously, and thus there is almost no influence of displacement due to body movement including heartbeat and respiration between an object image generated from the UTE data and another object image generated from the non-UTE data.

The UTE image and the non-UTE image are respectively generated in the step ST105 and the step ST106 in FIG. 4 from the UTE data and the non-UTE data acquired by execution of the pulse sequence illustrated in FIG. 5A, FIG. 5B, and FIG. 7.

In the next step ST107 in FIG. 4, a mask image is generated from the non-UTE image. The processing of the step ST107 is performed by the mask-image generation function 405 shown in FIG. 3.

As described above, in the UTE image, a part of the RF coil and/or the bed is often depicted as an undesired component around the object (i.e., the imaging target) originally intended to be depicted.

The desired object (i.e., intended object or imaging target) is extracted and the undesired components are removed or reduced from an image in which the desired object and undesired components are mixed. In the following description, this processing is referred to as a mask processing, in which the undesired components are removed or reduced from the mixed image while only the desired components are extracted from it. Note that the mask processing includes two types of processing. The first processing uses the mask image, which is described below, and the second processing does not use the mask image.

Further note that, in the following description, an image in which the region of the desired object and the rest region depicting the undesired components are separated is referred to as a "mask image". In the first embodiment, the mask image is used for performing the mask processing by applying the mask image to the UTE image, and the mask image is not generated from the UTE image but generated from the non-UTE image, in which undesired components such as the RF coil(s) and/or the bed are not depicted.

The mask image may be generated as a binary image, or a multivalued image having multivalued pixels. Hereinafter, a description will be given of a case where the mask image is generated as a binary by referring to FIG. 8 and FIG. 9.

Figure 8:
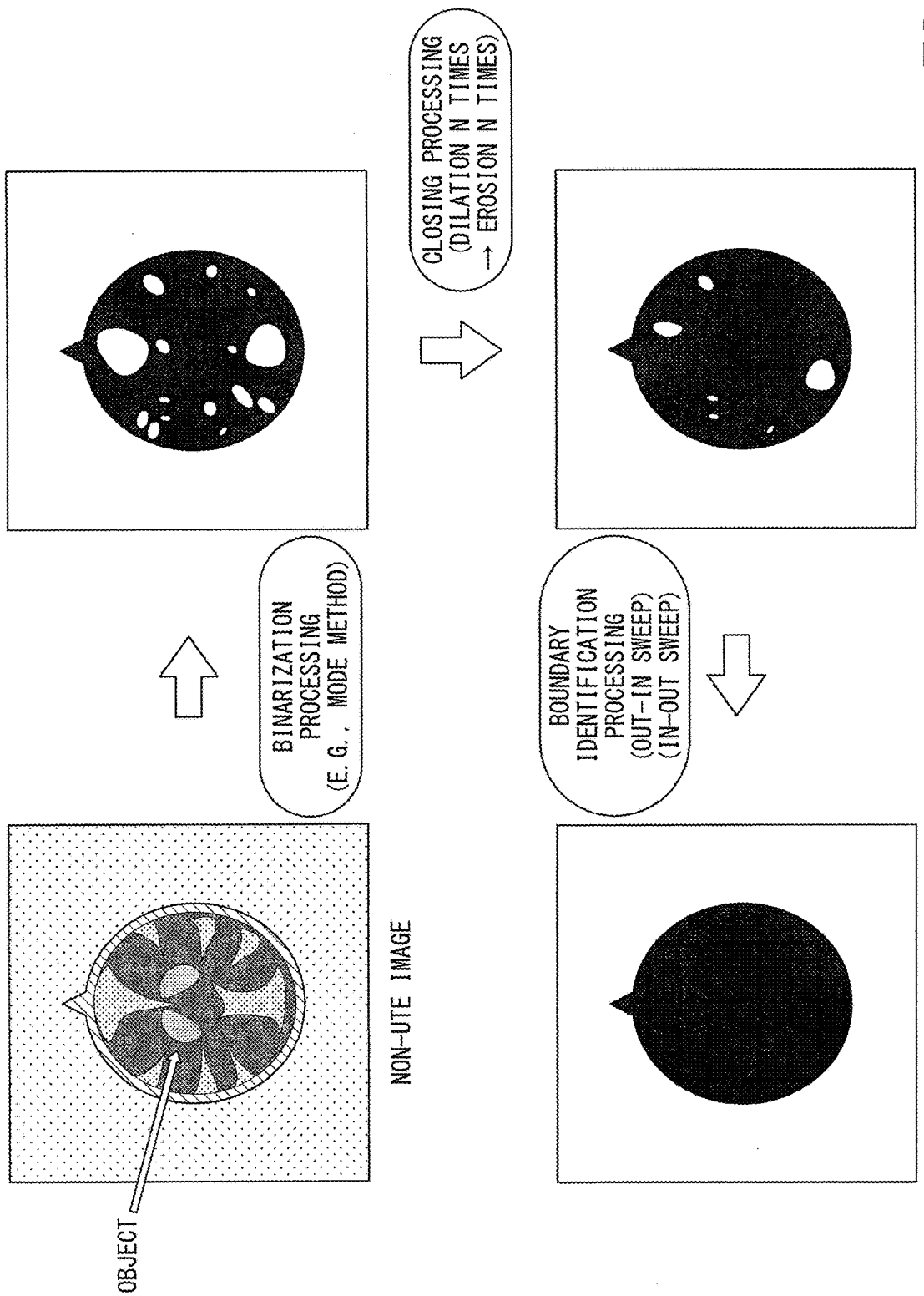
FIG. 8 is a conceptual diagram illustrating processing of generating a mask image from a non-UTE image.

As shown in FIG. 8, the mask image is generated by performing three types of processing on the non-UTE image, that is, (a) performing binarization processing, (b) closing processing, and (c) boundary identification processing. Among the three types of processing, the closing processing and the boundary identification processing are optionally performed, and are not always required.

First, the binarization processing is performed on the non-UTE image shown in the upper left of FIG. 8, and consequently, a binary image shown in the upper right of FIG. 8 is generated. The method of determining the threshold value for the binarization processing is not limited to a specific method. For instance, the binarization processing may be achieved by a "mode method", in which distribution of pixel values of the non-UTE image is obtained and the pixel value corresponding to the valley (i.e., local minimum value) of the distribution is used for the threshold value of the binarization processing.

In the binary image illustrated in FIG. 8, the black part corresponds to the region in which each pixel value is "1" (region equal to or above the threshold value), and the white part corresponds to the region in which each pixel value is "0" (region below the threshold value). The same holds true for FIG. 9 and FIG. 10.

When a discontinuous region remains inside the object depicted in the binary image, the closing processing may be subsequently performed. The closing processing is processing in which dilation processing is performed plural times (N times) and then the erosion processing is performed the same number of times (N times). The closing processing has an effect of removing a small pattern and/or a thin pattern. The image having been subjected to the closing processing is illustrated in the lower right of FIG. 8.

When a discontinuous region still remains inside the object after the closing processing, the boundary identification processing may be further performed.

Figure 9:
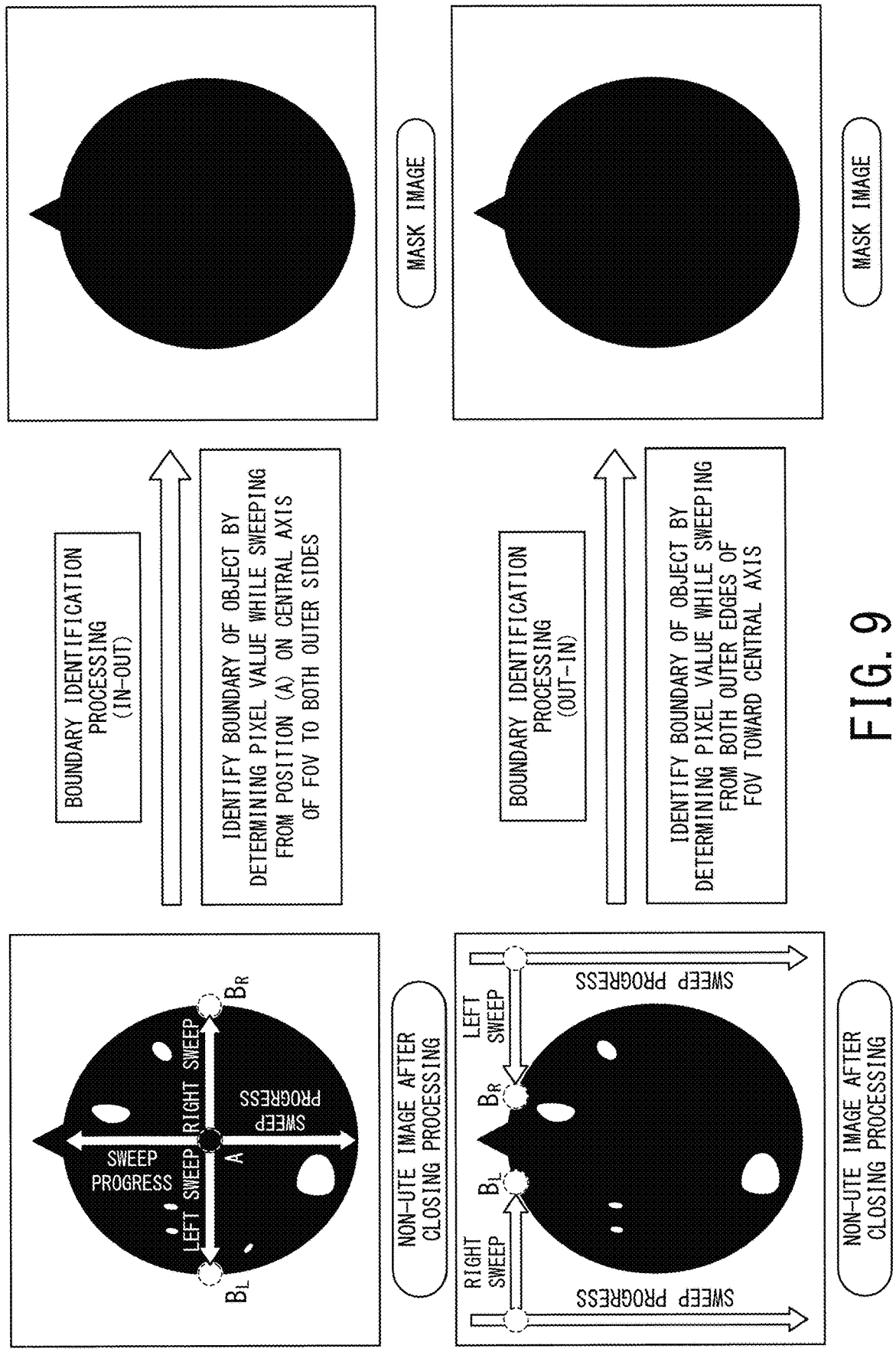
FIG. 9 is a conceptual diagram illustrating boundary identification processing.

FIG. 9 shows two types of the boundary identification processing. The upper part of FIG. 9 shows a type of "in-out" processing in the boundary identification processing, and the lower part of FIG. 9 shows a type of "out-in" processing in the boundary identification processing.

In the boundary identification processing ("in-out"), pixel values are examined by sweeping toward both outer sides from the position (A) on the central axis of Field of View (FOV), i.e., the substantial imaging range (i.e.,) of the non-UTE image. Then, change positions $B_L$ and $B_R$ at which the pixel value changes from "1" to "0" are sequentially determined along the central axis. After that, the boundary of the object is identified by connecting each of the determined change positions. Finally, by setting each pixel value of the inside of the identified boundary to "1" and setting each pixel value of the outside to "0", generation of the mask image is completed.

On the other hand, in the boundary identification processing ("out-in"), pixel values are examined by sweeping from both outer edges of the FOV toward the central axis. Then, the change positions $B_L$ and $B_R$ at which the pixel value changes from "0" to "1" are sequentially determined along both outer edges. After that, the boundary of the object is identified by connecting each of the determined change positions. Finally, by setting each pixel value of the inside of the identified boundary to "1" and setting each pixel value of the outside to "0", generation of the mask image is completed, in a similar manner as described above.

In the step ST108 of FIG. 4, the mask processing is performed on the UTE image by using the mask image generated in the above-described manner. The mask processing is implemented by the mask processing function 406.

Figure 10:
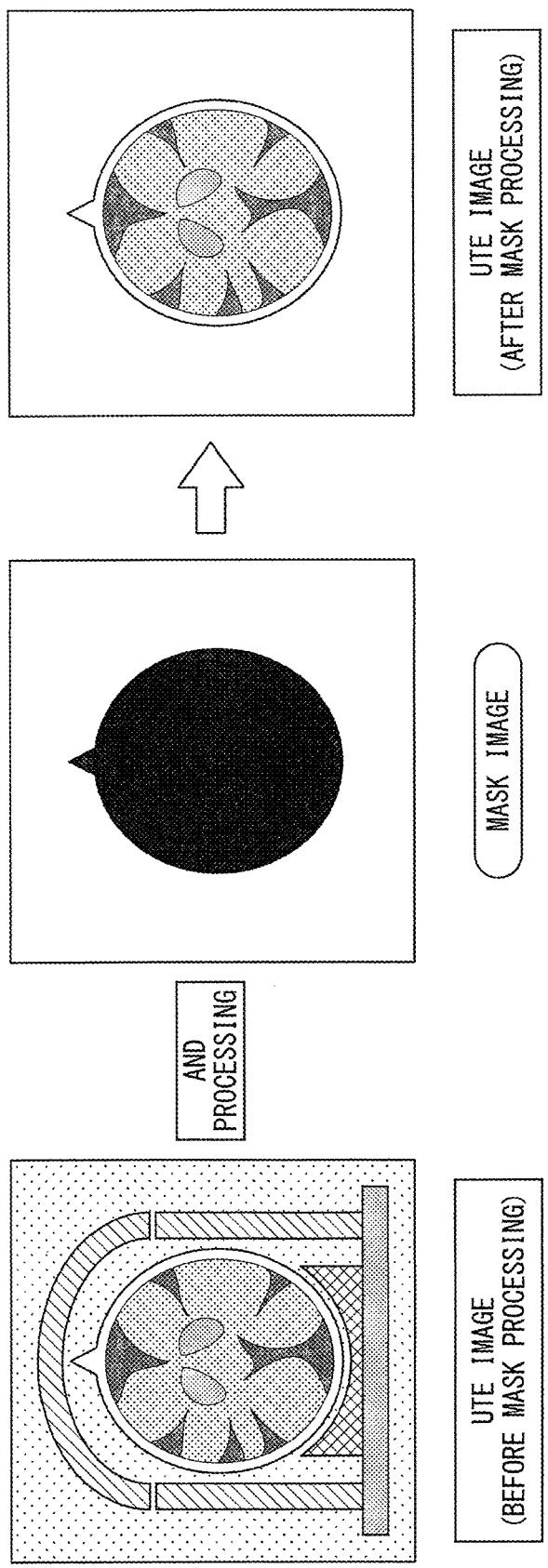
FIG. 10 is a conceptual diagram illustrating mask processing with the use of a mask image.

FIG. 10 is a schematic diagram illustrating the concept of the mask processing with the use of the mask image. The above-described mask image is an image in which each pixel value of the region of the desired object is "1" and each pixel value of the rest region outside the object is "0". In the case of such a mask image, the UTE image after the mask processing can be generated by applying AND processing to the mask image and the UTE image before the mask processing. In other words, it is possible to generate the corrected UTE image, in which only the region of the desired object is extracted, by simply taking the logical product of the mask image and the original UTE image.

Finally, the UTE image after the mask processing is displayed on the display 42 in the step ST109 of FIG. 4.

According to the MRI apparatus 1 of the first embodiment described above, even when undesired components such as an RF coil and a bed other than the desired object are depicted in the UTE image, the undesired components can be removed or reduced by simple processing with the use of the mask image.

Modification of First Embodiment

In the first embodiment described above, the non-UTE image is an image generated for the purpose of generating the mask image. In other words, the non-UTE data acquired by the pulse sequence shown in FIG. 5B and the non-UTE image generated from the non-UTE data acquired at the posterior stage of the pulse sequence shown in FIG. 7 are exclusively for generating the mask image.

In the modification of the first embodiment, an image of the same region of the same object generated for another purpose other than the mask image is also used for generating the mask image. For instance, diagnostic images of the same object such as a T1-weighted image, a T2-weighted image, or a diffusion-weighted image are usually non-UTE images, and these diagnostic images can be also used for generating the mask image. In addition, the mask image can be generated from a sensitivity map image for use in parallel imaging or a B1 map image that is acquired by imaging the distribution of the RF magnetic field.

Second Embodiment

Figure 11:
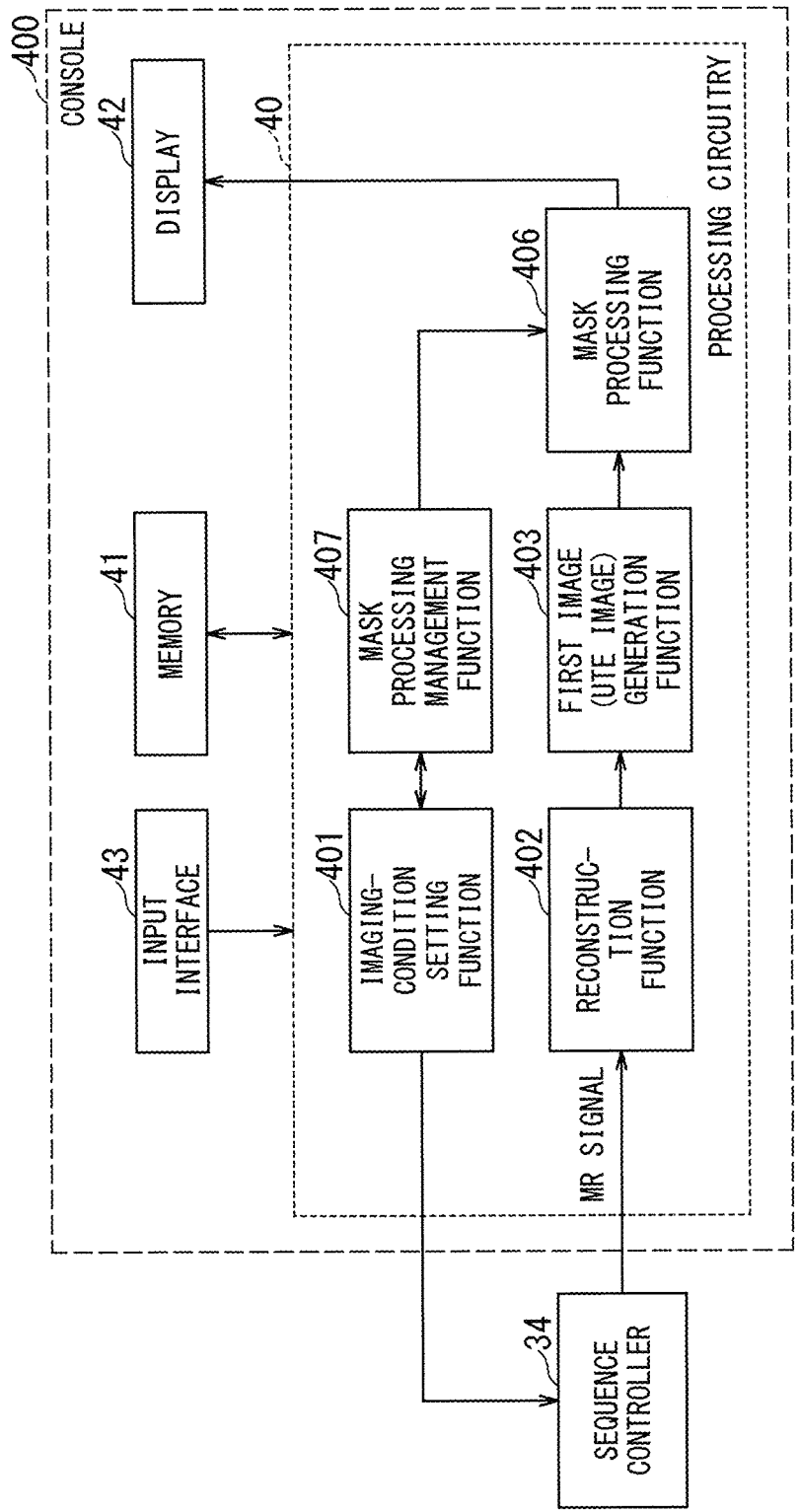
FIG. 11 is a functional block diagram illustrating the MRI apparatus of the second embodiment.

FIG. 11 is a block diagram illustrating the functions implemented by the console 400 in the MRI apparatus 1 of the second embodiment. Although the mask processing is performed by using the mask image in the first embodiment, the mask processing is performed without using the mask image in the second embodiment. Thus, in the block diagram shown in FIG. 11, the second image (non-UTE image) generation function 404 and the mask-image generation function 405 are removed from the block diagram (FIG. 3) of the first embodiment.

As one case of the mask processing without using the mask image, there is processing of removing or reducing undesired signals, which are present around the object and depicted as undesired components in the UTE image, by using information on the contour of the object.

For instance, in the case of imaging the head by using the head coil, the information on the contour of the object can be obtained from the shape information of the head coil.

Figure 12:
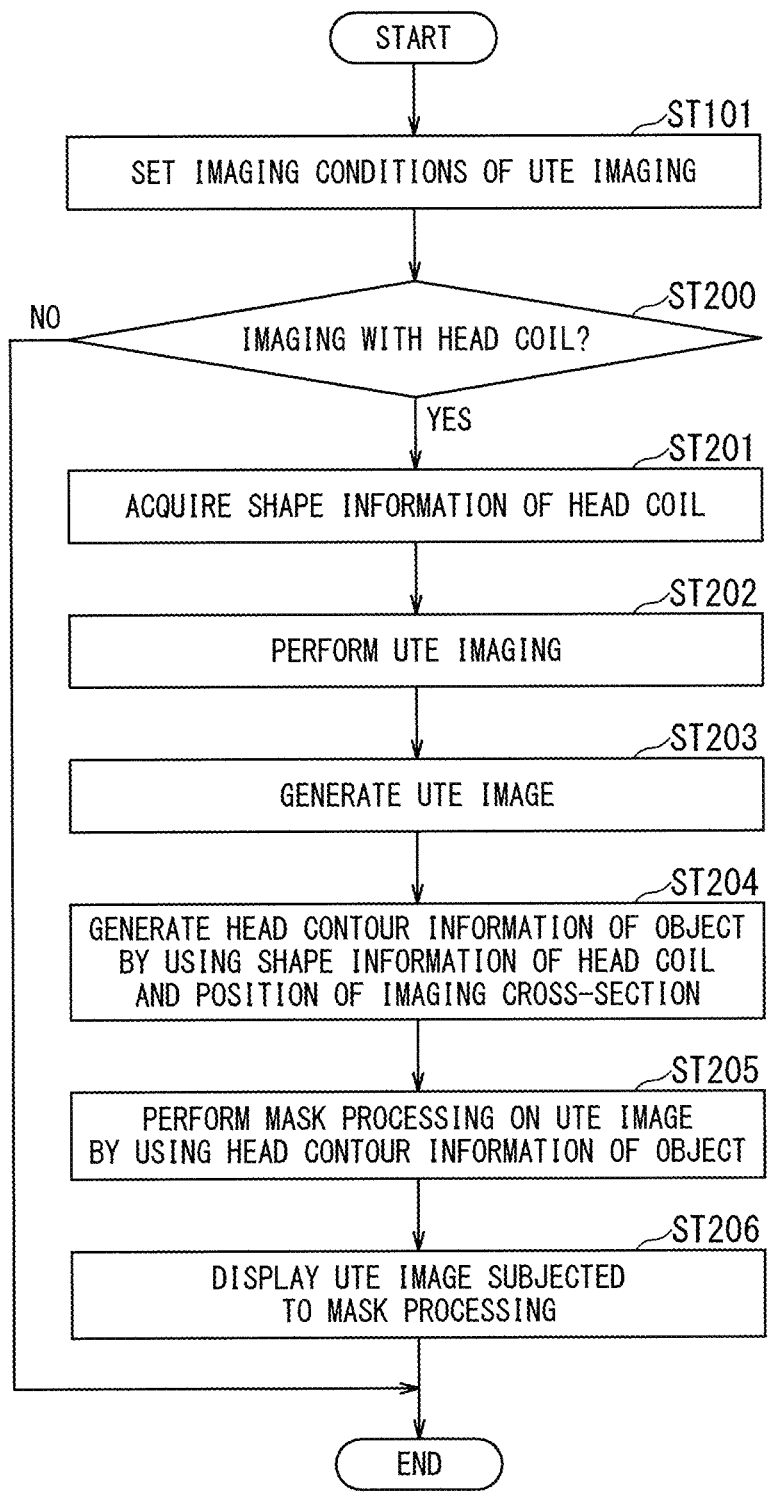
FIG. 12 is a flowchart illustrating processing performed by the MRI apparatus of the second embodiment.

FIG. 12 is a flow chart illustrating processing performed by the MRI apparatus 1 according to the second embodiment, in particular, processing of the second embodiment in the case of using the head coil.

Figure 13:
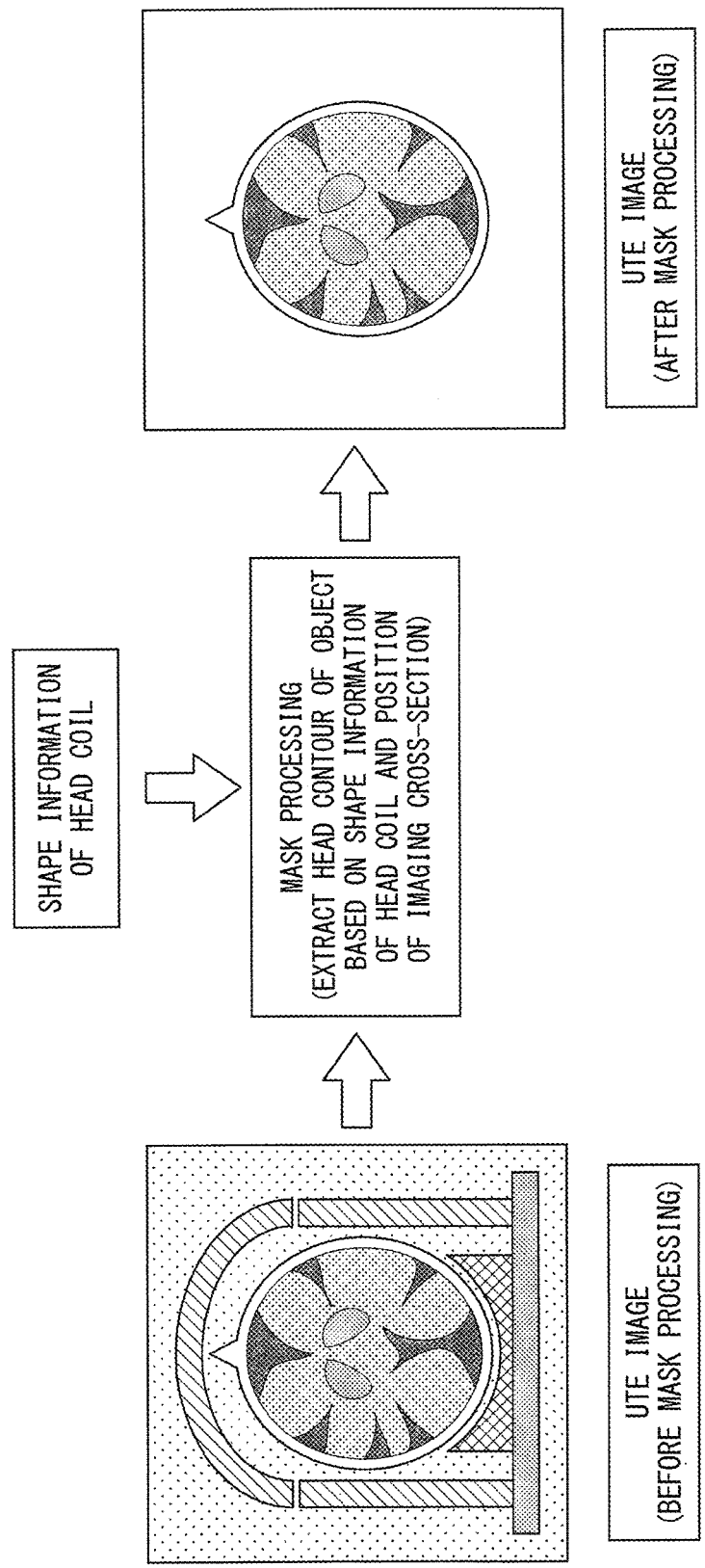
FIG. 13 is a schematic diagram illustrating a concept of the mask processing in the second embodiment.

FIG. 13 is a schematic diagram illustrating the operation concept of the mask processing of the second embodiment in which shape information of the head coil is used.

In the step ST101 of FIG. 12, the imaging conditions for the UTE imaging are set in a manner similar to the first embodiment. The imaging conditions to be set include the anatomical imaging part and the type of RF coil(s) used for imaging.

In the next step ST200, it is determined whether the UTE imaging is imaging with the use of the head coil or not. When it is determined that the UTE imaging with the use of the head coil is not performed, the processing is completed. In this case, instead of completing the processing, the processing may proceed to the step ST102 in FIG. 4 so that the processing of generating the mask image is performed as in the first embodiment by performing the processing of the steps ST102 to ST109.

When it is determined in the step ST200 that the UTE imaging with the use of the head coil is performed, the processing proceeds to the step ST201 in which the mask-processing management function 407 accesses the imaging-condition setting function 401 to obtain the shape information of the head coil.

In the next step ST202, the UTE imaging is performed.

In the next step ST203, the UTE image is generated.

In the next step ST204, head contour information of the object is generated from the shape information of the head coil and information on the position of the imaging cross-section. The reason for using the information on the position of the imaging cross-section in addition to the shape information of the head coil is because the cross-sectional shape of the head coil somewhat differs depending on the position of the imaging cross-section. The processing of the step ST204 is performed by the mask-processing management function 407, for instance.

In the next step ST205, the mask processing is performed on the UTE image by using the head contour information of the object. For instance, only the region surrounded by the head contour of the object is extracted from the UTE image, and consequently, the undesired components such as the head coil and the bed depicted around the object's head are removed from the original UTE image. The processing of the step ST205 is performed by the mask processing function 406.

In the final step ST206, the UTE image having been subjected to the mask processing is displayed on the display 42.

As another method of the mask processing without using the mask image, it is conceivable that threshold processing is performed on the UTE image to remove undesired signals below the threshold value. The mask processing with the use of such a threshold value is a simple processing that has the least processing burden compared with each mask processing method as described above. In particular, when the magnitude of the undesired signal of the RF coil or the bed included in the UTE image is somewhat smaller than the magnitude of the MR signals of the object as the desired signals, the mask processing with the use of such a threshold value is effective.

Third Embodiment

As described above, many types of the mask processing methods are applicable to the UTE image. Thus, a user needs to select and decide the mask processing method to be actually applied from many options.

Figure 14:
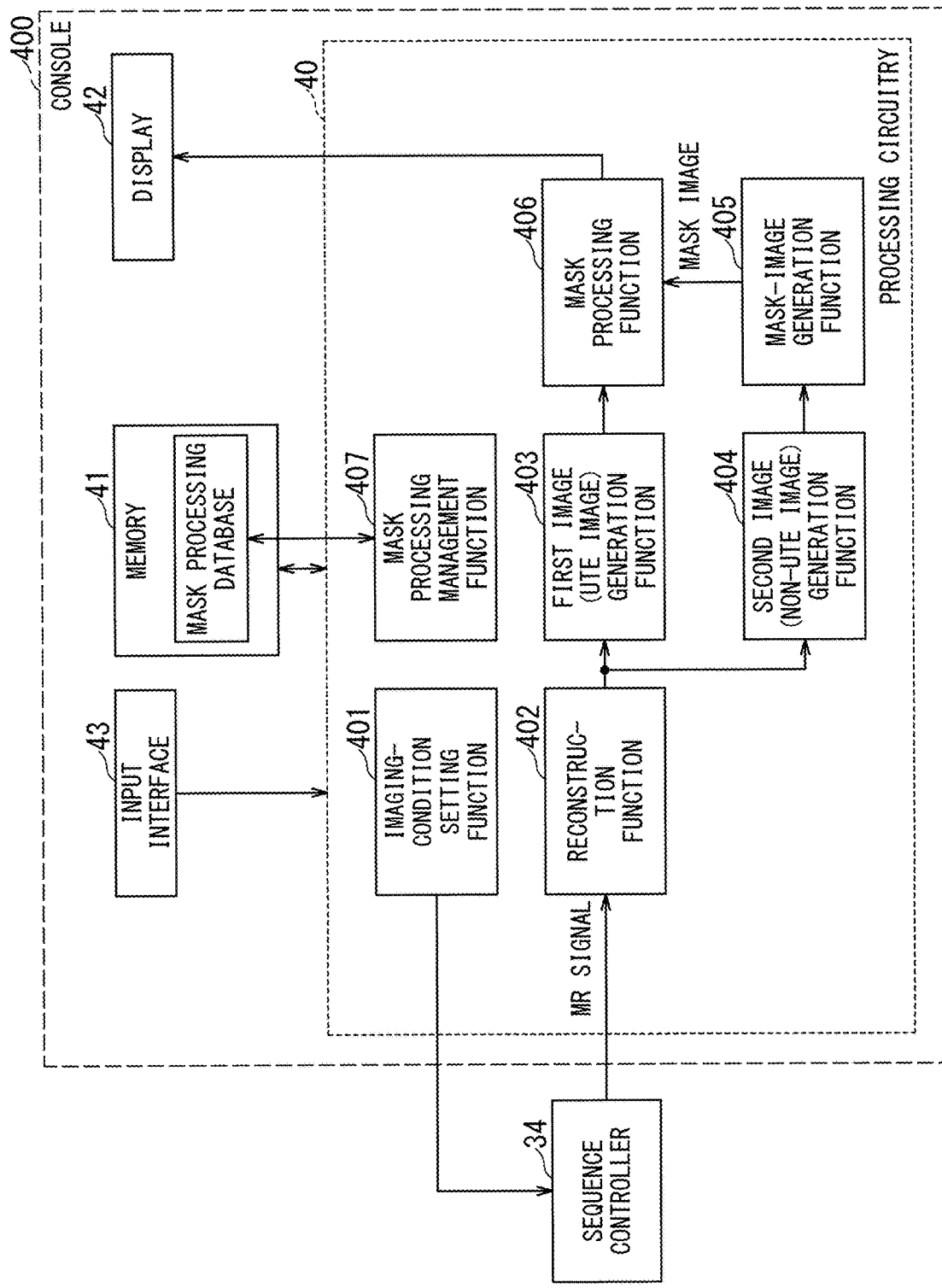
FIG. 14 is a functional block diagram illustrating the MRI apparatus of the third embodiment.

The MRI apparatus 1 of the third embodiment provides a means for assisting the user in selecting a mask processing method to be actually applied from the plural mask processing methods. FIG. 14 is a block diagram of the MRI apparatus 1 according to the third embodiment.

As shown in FIG. 14, the MRI apparatus 1 of the third embodiment further includes a mask-processing database in the memory 41. The mask-processing database is a database in which plural different types of mask processing methods are associated with selection conditions for selecting a specific mask processing method from among the plural mask processing methods.

The mask-processing management function 407 in the third embodiment refers to the mask-processing database on the basis of the selection conditions directly inputted by the user (or determined according to the input from the user), and reads out the specific mask processing method associated with these selection conditions from the database. In this manner, the mask-processing management function 407 selects and determines the mask processing method to be actually applied to the UTE image from among the plural mask processing methods.

Figure 15:
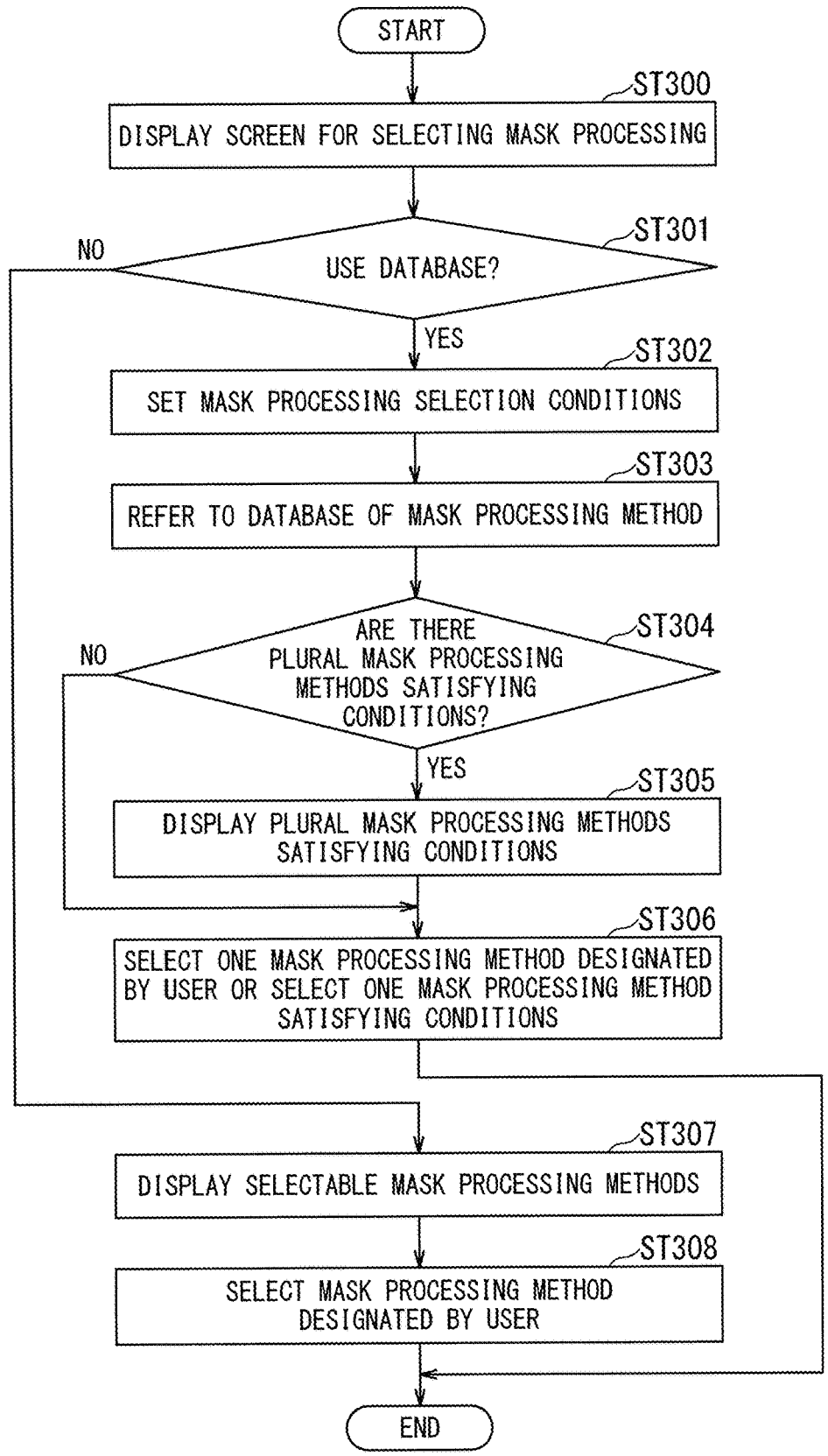
FIG. 15 is a flowchart illustrating processing performed by the MRI apparatus of the third embodiment.

FIG. 15 is a flowchart illustrating processing in the third embodiment, and is a flowchart illustrating processing until one mask processing method is selected and determined from among the plural mask processing methods.

In the step ST300, an initial screen for the mask processing selection is displayed on the display 42. For instance, the display 42 displays a screen for allowing the user to specify whether to use a database for selecting a mask processing method.

FIG. 16 is a table illustrating the mask-processing database. In the leftmost column of the table, selection conditions for selecting a mask processing method are arranged. The case of the table in FIG. 16 includes four types of selection conditions, which are "selection based on designation of coil type", "selection based on designation of protocol", "selection based on designation of anatomical imaging part", and "arbitrary selection by a user".

In the upper row of the table, plural mask processing methods are classified and arranged in hierarchical groups. The first hierarchy is classified into "the mask processing method without using the mask image" and "the mask processing method with the use of the mask image". The mask processing method without using the mask image is classified as the second hierarchy into "the method of removing or reducing undesired signals by using coil shape information at the time of the UTE imaging" and "the method of removing or reducing undesired signals by performing threshold processing on the UTE image".

The mask processing method with the use of the mask image is classified as the second hierarchy into "the method of generating the mask image by generating the non-UTE image exclusively for the mask processing" and "the method of generating the mask image by using the non-UTE image generated for another purpose".

The method of generating the mask image by generating the non-UTE image exclusively for the mask processing is classified into the method of using the dual-echo method illustrated in FIG. 7 and the method of using the single echo method illustrated in FIG. 5A and FIG. 5B. The method of generating the mask image by using the non-UTE image generated for another purpose is classified into a method of using a T1-weighted image, a method of using a T2-weighted image, a method of using a B1 map image, and a method of using a sensitivity map image.

In this database, each selection condition is associated with one or more mask processing methods. Further, in this table, the associations are shown by check marks "v". For instance, when "selection based on designation of coil type" is designated as the selection condition of the mask processing method, it is indicated by the check mark "V" that "the method of removing or reducing undesired signals by using shape information of the coil at the time of the UTE imaging" is associated with this selection condition.

The above-described mask-processing database is generated in advance of operation of the MRI apparatus 1 in the present embodiment, and is previously stored in the memory 41. As to the mask-processing database, the selection conditions and the mask processing methods can be added, deleted, or changed as needed, and the associations between the selection conditions and the mask processing methods can also be changed.

Returning to FIG. 15, when the user designates "use the database" in the step ST301 (i.e., YES in the step ST301), the processing proceeds to step ST302 in which setting of the mask-processing selection conditions is performed. In the step ST302, for instance, the mask-processing management function 407 causes the display 42 to display the four types of selection conditions illustrated in the leftmost column of the mask-processing database (i.e., "selection based on designation of coil type", "selection based on designation of protocol", "selection based on designation of anatomical imaging part", and "arbitrary selection by a user") in such a manner that the user can select any of them.

When the selection condition(s) is/are designated by the user, in the next step ST303, the mask-processing management function 407 refers to the mask-processing database and reads out the mask processing method associated with the designated selection condition(s).

When there is only one mask processing method associated with the designated selection condition(s) (NO in the step ST304), the processing proceeds to the step ST306 in which this mask processing method is determined as the mask processing method to be applied to the UTE image. For instance, when "selection based on designation of coil type" is designated by the user as the selection condition, the only mask processing method associated with this selection condition is "the method of removing and reducing undesired signals by using coil shape information at the time of the UTE imaging", and this mask processing method is determined as the mask processing method to be applied to the UTE image.

When there are plural mask processing methods associated with (i.e., satisfying) the designated selection condition(s) (YES in the step ST304), the processing proceeds to the step ST305 in which the mask-processing management function 407 causes the display 42 to display these plural mask processing methods satisfying the designated selection condition(s) in such a manner that the user can select any one of these plural mask processing methods. When one mask processing method is designated by the user, the processing proceeds to the step ST306 in which the designated mask processing method is determined as the mask processing method to be applied to the UTE image.

When the user designates "do not use the database" in the step ST301 (NO in the step ST301), the processing proceeds to the step ST307 in which all the selectable (i.e., applicable) mask processing methods are displayed on display 42 such that the user can select any one of them, for instance. Afterward, in the next step ST308, the mask processing method selected by the user is determined as the mask processing method to be applied to the UTE image.

According to the MRI apparatus 1 of the third embodiment described above, it is possible to easily select and determine the mask processing method applied to the UTE image from among the plural mask processing methods without imposing a burden of operation on the user.

According to at least one embodiment described above, it is possible to remove or reduce undesired signals that may be generated in the UTE imaging as MR signals from undesired objects around the imaging target.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An MRI apparatus comprising:
    a memory configured to store a predetermined program; and
    processing circuitry configured, by executing the predetermined program, to
        generate a first image based on first data acquired from an object with Ultrashort TE (UTE),
        generate a second image based on second data acquired from the object with non-UTE,
        generate a mask image only from the second image among the first and second images, and
        perform mask processing, by using the mask image, to remove or reduce an undesired signal around the object depicted in the first image.

2. The MRI apparatus according to claim 1,
    wherein the first data and the second data are obtained by acquiring magnetic resonance signals corresponding to the UTE and the non-UTE, by using a dual-echo method.

3. The MRI apparatus according to claim 1,
    wherein the first data and the second data are obtained by acquiring two magnetic resonance signals excited by one common excitation pulse;
    the first data are obtained by acquiring one of the two magnetic resonance signal at a first echo time, which is close to the excitation pulse; and
    the second data are obtained by acquiring another of the two magnetic resonance signals at a second echo time, which is longer than the first echo time and farther from the excitation pulse.

4. The MRI apparatus according to claim 1,
    wherein the first data and the second data are obtained from respective two separate magnetic resonance signals, which are acquired by application of two excitation pulses independent of each other; and
    a first echo time for acquiring one of the two separate magnetic resonance signals is set to be shorter than a second echo time for acquiring another of the two separate magnetic resonance signals.

5. The MRI apparatus according to claim 1,
    wherein an imaging method of acquiring the first data with the UTE is an imaging method in which an echo time (TE) is set such that a signal value of an undesired signal from a substance around the object becomes equal to or higher than a predetermined threshold value with respect to background noise; and
    an imaging method of acquiring the second data with the non-UTE is an imaging method in which the echo time (TE) is set such that a signal value of the undesired signal from the substance around the object becomes lower than a predetermined threshold value with respect to the background noise.

6. The MRI apparatus according to claim 1,
    wherein the object is a living body;
    an imaging method of acquiring the first data with the UTE is an imaging method in which an echo time (TE) is set such that a free induction decay signal from a non-living body around the object is received; and
    an imaging method of acquiring the second data with the non-UTE is an imaging method in which the echo time (TE) is set such that the free induction decay signal from the non-living body around the object is not received.

7. The MRI apparatus according to claim 1, wherein the processing circuitry is configured to generate the mask image by performing binarization processing on the second image.

8. The MRI apparatus according to claim 7, wherein the processing circuitry is configured to generate the mask image by further performing closing processing on the second image.

9. The MRI apparatus according to claim 8, wherein the processing circuitry is configured to generate the mask image by further performing boundary identification processing on the second image.

10. The MRI apparatus according to claim 1, wherein the second image is a diagnostic image of the object including a T1-weighted image or a T2-weighted image, a B1 map image acquired for the object, or a sensitivity map image acquired for the object; and the processing circuitry is configured to generate the mask image by using at least one of the diagnostic image, the B1 map image, and the sensitivity map image.

11. The MRI apparatus according to claim 1, wherein the processing circuitry is configured to generate the second image as an image exclusively for generating the mask image.

12. The MRI apparatus according to claim 1, wherein the memory is further configured to store a database in which plural different mask processing methods are associated with selection conditions for selecting a specific mask processing method from among the plural different mask processing methods; and the processing circuitry is configured to
select the specific mask processing method from the database based on at least one selection condition designated by a user, and
remove or reduce the undesired signal existing around the object based on the selected specific mask processing method.

13. An MRI apparatus comprising:
a memory configured to store a predetermined program; and
processing circuitry configured, by executing the predetermined program, to
generate a first image based on first data acquired from an object with Ultrashort TE (UTE),
acquire head shape information of the object from information about a head coil, and
perform mask processing, by using the head shape information acquired from the information about the head coil, to remove or reduce an undesired signal outside of a head of the object depicted in the first image.

14. The MRI apparatus according to claim 13, wherein the memory is further configured to store a database in which plural different mask processing methods are associated with selection conditions for selecting a specific mask processing method from among the plural different mask processing methods; and the processing circuitry is configured to
select the specific mask processing method from the database based on at least one selection condition designated by a user, and
remove or reduce the undesired signal existing around the object based on the selected specific mask processing method.

\* \* \* \* \*